United States Patent [19]

Furukawa et al.

[11] Patent Number: 5,030,580
[45] Date of Patent: Jul. 9, 1991

[54] METHOD FOR PRODUCING A SILICON CARBIDE SEMICONDUCTOR DEVICE

[75] Inventors: Katsuki Furukawa, Sakai; Akira Suzuki; Yoshihisa Fujii, both of Nara, all of Japan

[73] Assignee: Sharp Kabushiki Kaisha, Osaka, Japan

[21] Appl. No.: 574,487

[22] Filed: Aug. 23, 1990

[30] Foreign Application Priority Data

Aug. 28, 1989 [JP]  Japan ................................. 1-221207

[51] Int. Cl.⁵ ............................................ H01L 21/72
[52] U.S. Cl. ...................................... 437/22; 437/24; 437/100
[58] Field of Search ...................... 437/22, 100, 24

[56] References Cited

U.S. PATENT DOCUMENTS

| | | |
|---|---|---|
| 4,409,605 | 10/1983 | Ovshinsky et al. .................... 357/15 |
| 4,545,824 | 10/1985 | Salvi et al. ............................. 437/22 |
| 4,569,697 | 2/1986 | Tsu et al. ................................. 437/2 |
| 4,689,667 | 8/1987 | Aronowitz ............................ 437/25 |
| 4,748,131 | 5/1988 | Zietlou .................................. 437/24 |
| 4,818,721 | 4/1988 | Wang .................................... 437/24 |
| 4,947,218 | 8/1990 | Edmond ............................... 437/100 |
| 4,956,698 | 9/1990 | Wang ..................................... 357/15 |

FOREIGN PATENT DOCUMENTS

| | | |
|---|---|---|
| 124683 | 9/1979 | Japan ..................................... 437/24 |
| 0290716 | 12/1986 | Japan ..................................... 437/22 |
| 0073615 | 9/1987 | Japan ..................................... 437/22 |

OTHER PUBLICATIONS

Peter Wright et al.. Hot–Electron Immunity of $SiO_2$ Dielectric with Fluorine Incorporation, Aug. 1989, p. 347.

Primary Examiner—Olik Chaudhuri
Assistant Examiner—Long Pham
Attorney, Agent, or Firm—David G. Conlin

[57] ABSTRACT

A method for producing a silicon carbide semiconductor device having at least one of the p-type conductive layer and the n-type conductive layer is disclosed which includes the steps of: forming a silicon carbide single-crystal layer on a semiconductor substrate or semiconductor bulk single crystal; and implanting the III group of V group element ions in combination with fluorine ions in the silicon carbide single-crystal layer to form a p-type or n-type conductive layer, respectively.

6 Claims, 3 Drawing Sheets

METHOD FOR PRODUCING A SILICON CARBIDE SEMICONDUCTOR DEVICE

BACKGROUND OF THE INVENTION

1. Field of the invention

This invention relates to a method for producing a silicon carbide semiconductor device, and more particularly, to a method for producing a silicon carbide semiconductor device having a silicon carbide semiconductor layer, the conductivity type of which is controlled by ion implantation.

2. Description of the prior art

Semiconductor devices (which include diodes, transistors, integrated circuits, large-scale integrated circuits, light-emitting diodes, and charge-coupled devices) using silicon (Si) or a compound semiconductor such as gallium arsenide (GaAs) and gallium phosphide (GaP), have been widely used for practical applications in various fields of electronics.

Silicon carbide (SiC) is a semiconductor material with a wide energy gap of 2.2 to 3.3 electronvolts (eV), which is thermally, chemically and mechanically quite stable, and also has a great resistance to radiation damage. Furthermore, the saturation drift velocity of electrons in silicon carbide is greater than that in silicon (Si) and other semiconductor materials. The use of semiconductor devices made of conventional semiconductor materials such as silicon is difficult under severe conditions of high temperature, high output drive, high frequency operation, and radiation exposure. Therefore, semiconductor devices using silicon carbide are expected to have wide applications for devices which can be used under such conditions.

Despite these many advantages and capabilities, a silicon carbide semiconductor device has not yet been in actual use, because the technique still remains to be established for growing high quality silicon carbide single crystals having a large surface area with good reproducibility required for the commercial production thereof.

Conventional processes for preparing single-crystal substrates of silicon carbide on a laboratory scale include the so-called sublimation method (i.e., the Lely method) wherein silicon carbide powder is sublimed in a graphite crucible at 2,200° C. to 2,600° C. and recrystallized to obtain a silicon carbide single crystal, and the so-called epitaxial growth method wherein the silicon carbide single crystal obtained by the sublimation method is used as a substrate and a silicon carbide single-crystal layer is grown on the substrate by chemical vapor deposition (CVD) or liquid phase epitaxy (LPE), resulting in a silicon carbide single crystal, the size of which is sufficient to produce semiconductor device elements therefrom. Although a large number of crystals can be obtained by either the sublimation method or the epitaxial growth method, it is difficult to prepare large single crystals of silicon carbide and to control with high accuracy, the size and shape of single crystals of silicon carbide. Moreover, it is also difficult to control the polytype and the impurity concentration of these single crystals.

In recent years, the inventors have developed a process for growing large-sized high-quality single crystals of silicon carbide on a single-crystal substrate of silicon by the chemical vapor deposition (CVD) technique and filed a Japanese Patent Application No. 58-76842 (76842/1983) which corresponds to U.S. Pat. No. 4,623,425. This process (referred to as a successive two step CVD technique) includes growing a thin film of silicon carbide on a silicon substrate by the CVD technique at a low temperature and then growing a single-crystal film of silicon carbide on the said thin film by the CVD technique at a higher temperature. At the present time, this technique makes it possible to control the conductivity type, the impurity concentration, or the like of silicon carbide single crystals obtained by adding an appropriate amount of impurities during the growth of the single crystals. Therefore, this technique makes many contributions to the development of various semiconductor devices in which silicon carbide single crystals are used.

Moreover, it is disclosed that silicon carbide layers grown on silicon substrates or silicon carbide substrates can be doped during the growth by chemical vapor deposition or doped after the growth by ion implantation with boron (B) or aluminum (Al) ions as the p-type impurity or phosphorous (P) or nitrogen (N) ions as the n-type impurity (see, e.g., H. Kong, H. J. Kim, J. A. Edmond, J. W. Palmour, J. Ryu, C. H. Carter, Jr., J. T. Glass, and R. F. Davis, Mat. Res. Soc. Symp. Proc., Vol. 97 (1987), pp. 233-245).

However, because temperatures used for chemical vapor deposition are usually high, for example, silicon carbide semiconductor devices with a p-n junction, which are obtained using a chemical vapor deposition technique, will exhibit unsatisfactory electrical characteristics. Therefore, the above-mentioned method is not suitable for forming silicon carbide semiconductor layers to which a certain amount of impurities are added.

For the production of semiconductor devices using silicon (more particularly, those having a planar configuration), thermal impurity diffusion or ion implantation has been widely used as an essential process technique therefore.

However, thermal impurity diffusion is not suitable as a process technique for the production of silicon carbide semiconductor devices, because the diffusion constant of impurities in silicon carbide is quite small and because diffusion temperatures of 1,600° C. or more are required for this technique.

Referring to ion implantation as a process technique, implantation of the group V element ions (e.g., nitrogen (N) or phosphorous (P) ions) is used for practical application. The silicon carbide layer in which these ions have been implanted can be electrically activated by thermal annealing. However, electrical activation for the group V element ions (i.e., ratio of the sheet carrier concentration to the dose of implanted ions) is as low as 80% or less, even when thermal annealing for the activation of implanted ions is conducted at high temperatures of 1,300° C. or more. In cases where the group III element ions (e.g., boron (B) or aluminum (Al) ions) are implanted in a silicon carbide layer (for example, the inventors have devised a method for forming a high-resistance silicon carbide single-crystal layer by implanting the III group element ions, such as boron (B) ions, aluminum (Al) ions, or gallium (Ga) ions, and filed a Japanese Patent Application No. 1-75665 which corresponds to U.S. patent application Ser. No. 499,889), although the implanted impurity ions are distributed in the silicon carbide layer according to the view based on the theory, the silicon carbide layer is not activated electrically to a satisfactory extent.

SUMMARY OF THE INVENTION

The method for producing a silicon carbide semiconductor device of this invention, which overcomes the above-discussed and numerous other disadvantages and deficiencies of the prior art, comprises the steps of: forming a silicon carbide single-crystal layer; and implanting the III group or V group element ions in combination with fluorine ions in the silicon carbide single-crystal layer to form a p-type or n-type conductive layer, respectively.

In a preferred embodiment, the above-mentioned method further comprises the step of annealing the p-type or n-type conductive layer to activate the ions implanted therein.

In a preferred embodiment, the above-mentioned silicon carbide single-crystal layer is formed on a substrate or bulk single crystal, examples of which include silicon substrates, silicon carbide substrates, silicon carbide bulk single crystals, or the like.

In a preferred embodiment, the above-mentioned group III element ions are selected from the group consisting of boron (B) ions, aluminum (Al) ions, and gallium (Ga) ions.

In a preferred embodiment, the abovementioned group V element ions are selected from the group consisting of nitrogen (N) ions, phosphorous (P) ions, and arsenic (As) ions.

Thus, the invention described herein makes possible the objectives of (1) providing a method for producing a silicon carbide semiconductor device which has a silicon carbide semiconductor layer activated electrically to a satisfactory extent, even though the group III or group V element ions are implanted therein; (2) providing a method for producing a silicon carbide semiconductor device which has a silicon carbide semiconductor layer, the conductivity type of which is controlled by ion implantation, because a high-activated layer can be obtained from silicon carbide, even though the group III element ions as the p-type impurity or the group V element ions as the n-type impurity are implanted therein; (3) providing a method for producing a silicon carbide semiconductor device which can be used under severe conditions of high temperature, high output drive, high frequency operation, and radiation exposure, where difficulties are encountered with devices made of conventional semiconductor materials, particularly silicon; and (4) providing a method for producing a silicon carbide semiconductor device, which can be executed with the use of a conventional ion implantation system, thereby making it possible to produce silicon carbide semiconductor devices, such as transistors and integrated circuits, on an industrial scale.

BRIEF DESCRIPTION OF THE DRAWINGS

This invention may be better understood and its numerous objectives and advantages will become apparent to those skilled in the art by reference to the accompanying drawings as follows:

FIGS. 1b to 1e are schematic sectional views showing the production of the silicon carbide semiconductor device of FIG. 1a.

DETAILED DESCRIPTION OF THE INVENTION

Figure 1A:
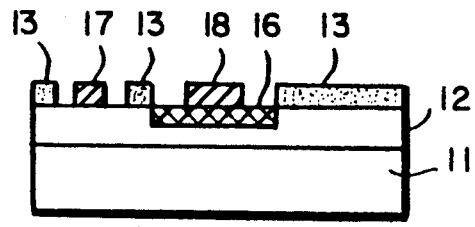
FIG. 1a is a schematic sectional view showing a silicon carbide semiconductor device of this invention.

In general, a silicon carbide semiconductor cannot be activated, even if the group III element ions alone are implanted therein. It is also noted that electrical activation for the group V element ions in a silicon carbide semiconductor is low as compared with other semiconductors such as silicon. On the other hand, fluorine ions are very active and used for preventing the diffusion of ions implanted in a silicon semiconductor.

In the method of this invention, the group III or group V element ions are implanted in a silicon carbide semiconductor layer in combination with fluorine ions, and the group III or group V element ions thus implanted are then activated in the presence of the active fluorine ions. According to this arrangement, the group III element ions present in the silicon carbide semiconductor layer can readily be activated, or electrical activation for the group V element ions can be significantly improved.

Ion implantation is conducted, for example, by implanting fluorine ions first, then implanting the group III or group V element ions. Alternatively, the procedure may be reversed, that is, the group III or group V element ions are implanted first, and then the fluorine ions are implanted. It is also possible to implant fluorine ions and the group III or group V element ions simultaneously.

As the group III element ions used for ion implantation in this invention, for example, boron (B) ions, aluminum (Al) ions, or gallium (Ga) ions can be used. As the group V element ions used for ion implantation in this invention, for example, nitrogen (N) ions, phosphorus (P) ions, or arsenic (As) ions can be used.

The implantation energy is usually in the range of from 10 to 200 keV, resulting in an ion distribution with an average depth ranging from 1,000 Å to 2 $\mu$m. The dose of implanted ions is usually in the range of from $1 \times 10^{12}$ cm$^{-2}$ for threshold adjustment to $1 \times 10^{18}$ cm$^{-2}$ for buried insulators. Preferably, the dose of implanted ions is in the range of from $1 \times 10^{14}$ cm$^{-2}$ to $1 \times 10^{15}$ cm$^{-2}$. The energy and dose for implantation are conveniently determined according to the kind of ions to be implanted, and the like.

The implantation of ions (i.e., the group III or group V element ions in combination with fluorine ions) in a silicon carbide layer only changes the electrical properties of the silicon carbide layer. As is well known, in cases where implantation energy is high, such implantation damages the target and displaces many atoms for each implanted ion. The electrical behavior after implantation is dominated by deep-level electrons and hole traps, which capture carriers and make the resistivity high. Therefore, annealing is required to repair lattice damage and activate implanted ions electrically (i.e., put dopant atoms on substitutional sites where they will be electrically active).

For the purpose of activating implanted ions, rapid thermal annealing, where annealing times are in the order of seconds, or more conventional furnace annealing, where times are in the order of minutes, can be used. The annealing temperature is preferably within the range of 1,000° C. to 1,400° C. The time and temperature for annealing are conveniently determined according to the kind of implanted ions, the implantation energy, and the like.

DESCRIPTION OF THE PREFERRED EMBODIMENTS

The invention will be further explained by reference to the following examples.

EXAMPLE 1

This example will describe a silicon carbide semiconductor device in which a p-type conductive layer is formed by implanting aluminum (Al) ions as the group III element ions in combination with fluorine (F) ions.

Figure 1B:
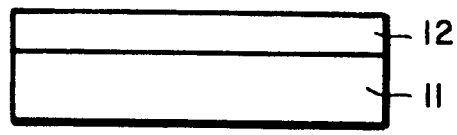
Figure 1C:
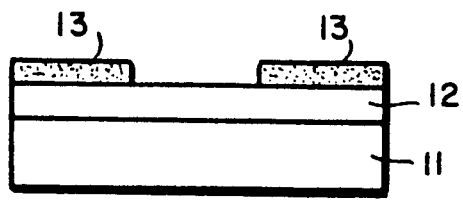

First, as shown in FIG. 1b, on a silicon (Si) single-crystal substrate 11, an unintentionally doped silicon carbide (SiC) single-crystal layer 12 (the thickness thereof being about 10 $\mu$m) was grown by chemical vapor deposition (CVD). Then, a silicon dioxide (SiO$_2$) film 13 (the thickness thereof being about 5,000 Å) was formed over the entire surface of the unintentionally doped SiC single-crystal layer 12, after which the prescribed portion of the SiO$_2$ film 13 was etched to form an opening therein, as shown in FIG. 1c.

Figure 1D:
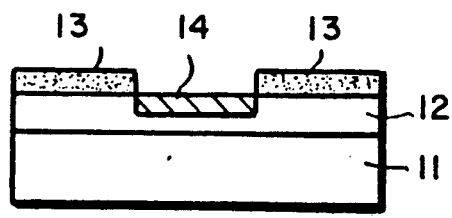
Figure 1E:
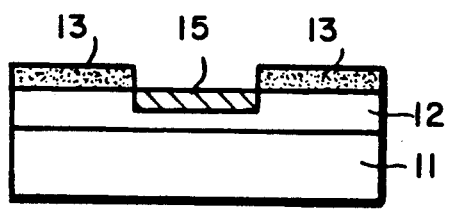

Next, fluorine ions (i.e., $^{19}$F$^+$) were implanted in the unintentionally doped SiC single-crystal layer 12 through the opening with the use of an ion implantation system, whereby a fluorine-ion implanted layer 14 was formed, as shown in FIG. 1d. The implantation energy was 100 keV and the dose of fluorine ions implanted was $3 \times 10^{14}$ cm$^{-2}$. Subsequently, aluminum ions (i.e., $^{27}$Al$^+$) were implanted in the fluorine-ion implanted layer 14, whereby a mixed-ion implanted layer 15 was formed in which fluorine ions and aluminum ions were present together, as shown in FIG. 1e. The implantation energy was 150 keV and the dose of aluminum ions implanted was $5 \times 10^{14}$ cm$^{-2}$.

Thereafter, annealing was conducted in an argon atmosphere at a temperature of 1,100° C. for 30 minutes, whereby the fluorine ions and aluminum ions present in the mixed-ion implanted layer 15 were activated. The measurements by a thermal four-point probe technique or Hall effect technique indicated that a p-type conductive layer 16 had been formed, as shown in FIG. 1a.

Finally, the prescribed portion of the SiO$_2$ film 13 was removed, and then ohmic electrodes 17 and 18 were formed by deposition of aluminum metal, resulting in a silicon carbide semiconductor device as shown in FIG. 1a.

Figure 2:
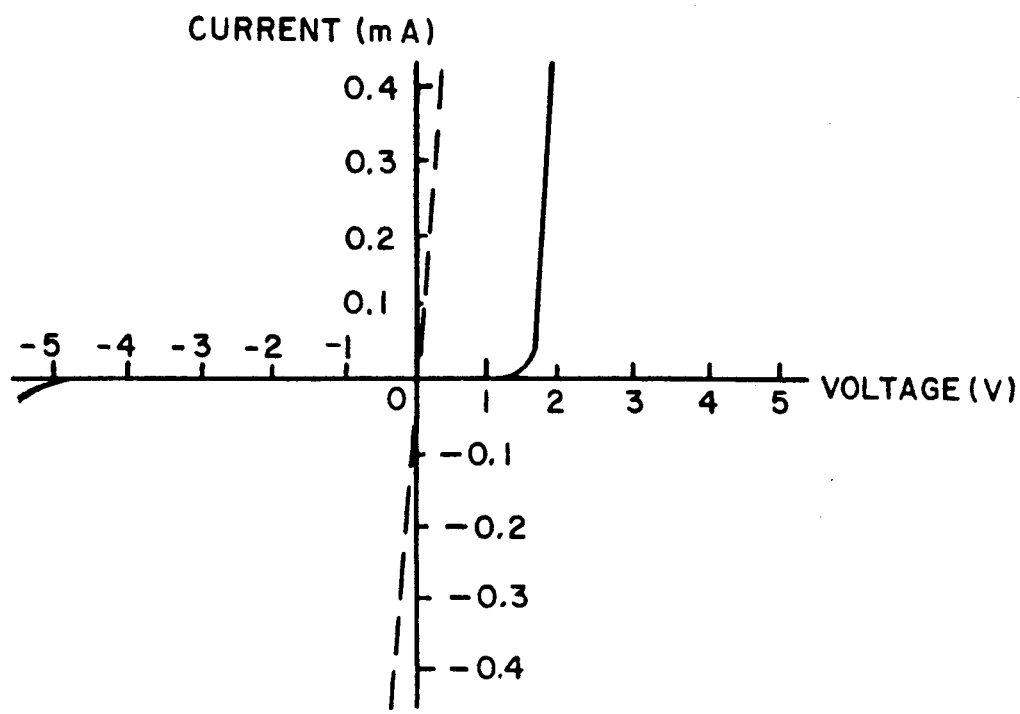
FIG. 2 is a graph showing the current-voltage characteristics (solid-line curve) of the silicon carbide semiconductor device of FIG. 1a, as well as the current-voltage characteristics (dotted-line curve) of the conventional silicon carbide semiconductor device produced for comparison.

The measurements of the current-voltage characteristics with respect to the silicon carbide semiconductor device obtained as described above showed satisfactory rectifying characteristics, as indicated by the solid-line curve in FIG. 2.

For the purpose of comparison, a silicon carbide semiconductor device was produced in the same manner as described above, except that only aluminum ions were implanted in the unintentionally doped SiC single-crystal layer 12 without implanting fluorine ions therein. As can be seen from the dotted-line curve in FIG. 2, such a semiconductor device exhibited no satisfactory rectifying characteristics, because the aluminum ions present in the p-type conductive layer 16 were not sufficiently activated.

EXAMPLE 2

This example will describe the annealing-temperature dependence of electrical activation for n-type conductive layers obtained by implanting phosphorous ions as the group V element ions in combination with fluorine ions.

Figure 3A:
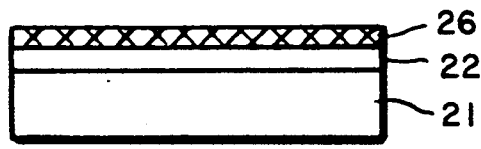
FIGS. 3a to 3d are schematic sectional views showing the production of a n-type conductive layer according to the method of this invention, for the purpose of examining the change in the degree of activation for implanted ions with annealing temperature.
Figure 3B:
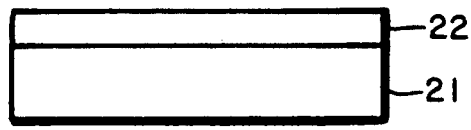

First, as shown in FIG. 3b, on an Si single-crystal substrate 21, an Al-doped p-type SiC single-crystal layer 22 (the thickness thereof being about 10 $\mu$m) was grown by chemical vapor deposition (CVD).

Figure 3C:
Figure 3D:
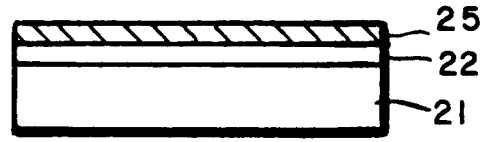

Then, fluorine ions (i.e., $^{19}$F$^+$) were implanted in the entire surface of the Al-doped p-type SiC single-crystal layer 22, whereby a fluorine-ion implanted layer 24 was formed, as shown in FIG. 3c. The implantation energy was 70 keV and the dose of fluorine ions implanted was $3 \times 10^{14}$ cm$^{-2}$. Subsequently, phosphorous ions ($^{31}$P$^+$) were implanted in the fluorine-ion implanted layer 24, whereby a mixed-ion implanted layer 25 in which fluorine ions and phosphorous ions were present together was formed, as shown in FIG. 3d. The implantation energy was 120 keV and the dose of phosphorous ions implanted was $3.9 \times 10^{14}$ cm$^{-2}$.

Thereafter, annealing was conducted in an argon atmosphere at a temperature in the range of about 1,000° C. to about 1,300° C. for 30 minutes, whereby the fluorine ions and phosphorous ions present in mixed-ion implanted layer 25 were activated. The measurements by a thermal four-point probe technique or Hall effect technique indicated that an n-type conductive layer 26 had been formed, as shown in FIG. 3a.

Figure 4:
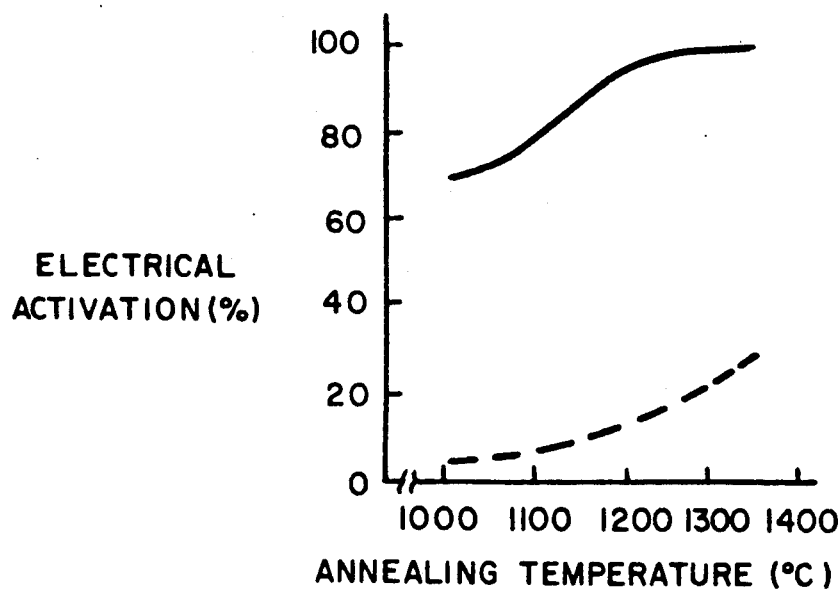
FIG. 4 is a graph showing the annealing-temperature dependence of electrical activation with respect to the n-type conductive layer formed as shown in FIGS. 3a to 3d (solid-line curve) and the n-type conductive layer formed for comparison (dotted-line curve).

In order to examine annealing-temperature dependence of electrical activation, the measurements of sheet carrier concentration were made with respect to various n-type conductive layers obtained by annealing at different temperatures within the above range, whereby the electrical activation was obtained as a ratio of the sheet carrier concentration to the dose of implanted ions. The relationship between the electrical activation and the annealing temperature thus obtained is shown by the solid-line curve in FIG. 4. As can be seen from this figure, the n-type conductive layers formed according to the method of this invention exhibited a satisfactorily high degree of activation, even when annealing was conducted at a low temperature of about 1,000° C.

For the purpose of comparison, n-type conductive layers were formed in the same manner as described above, except that only phosphorous ions were implanted in the Al-doped SiC single-crystal layer 22 without implanting fluorine ions therein. As can be seen from the dotted-line curve in FIG. 4, such n-type conductive layers exhibited only a low electrical activation, even when annealing was conducted at a higher temperature of, for example, about 1,300° C.

The silicon carbide semiconductor devices described in the above examples have a structure in which a silicon carbide single-crystal layer is formed on a silicon single-crystal substrate. However, the silicon carbide semiconductor device of this invention is not restricted thereto. The excellent advantages of this invention can also be attained in cases where silicon carbide semiconductor devices has a structure in which a silicon carbide single-crystal layer is formed on a silicon carbide substrate or silicon carbide bulk single crystal.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing a silicon carbide semiconductor device having at least one of the p-type conductive layer and the n-type conductive layer, comprising the steps of: forming a silicon carbide single-crystal layer; and implanting the III group or V group element ions in combination with fluorine ions in said silicon carbide single-crystal layer to form a p-type or n-type conductive layer, respectively.

2. A method according to claim 1, further comprising the step of annealing said p-type or n-type conductive layer to activate the ions implanted therein.

3. A method according to claim 1, wherein said silicon carbide single-crystal layer is formed on a semiconductor substrate.

4. A method according to claim 1, wherein said silicon carbide single-crystal layer is formed on a semiconductor bulk single crystal.

5. A method according to claim 1, wherein said group III element ions are selected from the group consisting of boron (B) ions, aluminum (Al) ions, and gallium (Ga) ions.

6. A method according to claim 1, wherein said group V element ions are selected from the group consisting of nitrogen (N) ions, phosphorous (P) ions, and arsenic (As) ions.

* * * * *